US012687772B2

(12) United States Patent
Kim et al.

(10) Patent No.: US 12,687,772 B2
(45) Date of Patent: Jul. 21, 2026

(54) SHADOW MASK AND METHOD OF MANUFACTURING BLANK MASK USING THE SAME

(71) Applicant: LuminaMask Co., Ltd., Cheonan-si (KR)

(72) Inventors: Seong Yoon Kim, Seoul (KR); GeonGon Lee, Seoul (KR); Min Gyo Jeong, Seoul (KR); Sung Hoon Son, Seoul (KR); Inkyun Shin, Seoul (KR)

(73) Assignee: LuminaMask Co., Ltd., Cheonan-si (KR)

( * ) Notice: Subject to any disclaimer, the term of this patent is extended or adjusted under 35 U.S.C. 154(b) by 557 days.

(21) Appl. No.: 18/309,427

(22) Filed: Apr. 28, 2023

(65) Prior Publication Data

US 2023/0408903 A1     Dec. 21, 2023

(30) Foreign Application Priority Data

May 18, 2022 (KR) ........................ 10-2022-0060886

(51) Int. Cl.
| *G03F 1/38* | (2012.01) |
| *G03F 1/68* | (2012.01) |
| *G03F 7/00* | (2006.01) |
| *G03F 7/20* | (2006.01) |

(52) U.S. Cl.
CPC .................. *G03F 1/38* (2013.01); *G03F 1/68* (2013.01); *G03F 7/2047* (2013.01); *G03F 7/706851* (2023.05)

(58) Field of Classification Search
CPC . G03F 1/38; G03F 1/68; G03F 7/2047; G03F 7/706851; G03F 1/50; G03F 1/00; C23C 14/042
See application file for complete search history.

(56) References Cited

U.S. PATENT DOCUMENTS

| 6,132,805 | A | 10/2000 | Moslehi |
| 2002/0051915 | A1 | 5/2002 | Karamatsu |
| 2014/0065293 | A1 | 3/2014 | Kim et al. |
| 2014/0183320 | A1 | 7/2014 | Son et al. |
| 2016/0266485 | A1 | 9/2016 | Inazuki et al. |
| 2019/0242007 | A1* | 8/2019 | Rotte ...................... C23C 14/22 |

FOREIGN PATENT DOCUMENTS

| JP | H10-60624 | A | | 3/1998 | |
| JP | 2000338649 | A | * | 12/2000 | ......... G03F 7/70541 |
| JP | 2008088509 | A | * | 4/2008 | |
| JP | 2015-503772 | A | | 2/2015 | |
| JP | 2016-170320 | A | | 9/2016 | |
| JP | 2017-172028 | A | | 9/2017 | |
| KR | 10-2007-0013441 | A | | 1/2007 | |
| KR | 10-2008-0055124 | A | | 6/2008 | |

(Continued)

*Primary Examiner* — Christopher W Raimund
(74) *Attorney, Agent, or Firm* — NSIP Law

(57) ABSTRACT

A shadow mask includes a mask including one surface, another surface, and an opening that passes from one surface to the other, and a shutter provided on the one surface of the mask and configured to adjust a size of the opening, wherein the shutter is configured to move from an edge to a center of the opening to adjust the size of the opening, and the shadow mask is applied in manufacturing a blank mask for a semiconductor lithography process.

12 Claims, 7 Drawing Sheets

(56)     References Cited

FOREIGN PATENT DOCUMENTS

| KR | 10-2012-0081641 | A | 7/2012 |
| KR | 10-1218115 | B1 | 1/2013 |
| KR | 10-2013-0078009 | A | 7/2013 |
| KR | 10-2013-0119477 | A | 10/2013 |
| KR | 10-2014-0084717 | A | 7/2014 |
| KR | 10-2016-0120617 | A | 10/2016 |
| KR | 10-1670351 | B1 | 10/2016 |
| TW | 202205031 | A | 2/2022 |

* cited by examiner

SHADOW MASK AND METHOD OF MANUFACTURING BLANK MASK USING THE SAME

CROSS-REFERENCE TO RELATED APPLICATION

This application claims the benefit under 35 U.S.C. § 119(a) of Korean Patent Application No. 10-2022-0060886, filed on May 18, 2022, the entire disclosure of which is incorporated herein by reference for all purposes.

BACKGROUND

1. Technical Field

The following description relates to a shadow mask and a method of manufacturing a blank mask using the same.

2. Discussion of Related Art

A blank mask, which is a basic form of photomask currently applied in semiconductor mass production, uses two or more multilayer thin films to maximize resolution. In order to fabricate these multilayer thin films, multiple film deposition processes should be performed, and a shadow mask must be used in the sputtering equipment as masks of different sizes during deposition in order to process the outer boundaries of each thin film.

This is to minimize the defects caused by layer lifting occurring at the outer boundaries of each thin film and to ensure that the photomask used as a blank mask can play a proper role.

Thus, when manufacturing a multilayer thin film blank mask, it is essential to perform a blank mask deposition process using shadow masks having various sizes, and various methods have been tried to improve the efficiency of the process.

The above-described background art is technical information possessed by the inventor for derivation of an implementation or acquired during a derivation process, and that is not necessarily referred to as a widely known technology disclosed to the general public prior to the filing of the present disclosure.

Examples of the related art include "method of manufacturing mask blank and mask blank" disclosed in Korean Patent Registration No. 10-1670351 and "shadow mask and method of depositing thin film using same" disclosed in Korean Patent Registration No. 10-1218115.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a shadow mask includes a mask including one surface, another surface, and an opening that passes from one surface to the other, and a shutter provided on the one surface of the mask and configured to adjust a size of the opening, wherein the shutter is configured to move from an edge to a center of the opening to adjust the size of the opening, and wherein the shadow mask is applied in manufacturing a blank mask for a semiconductor lithography process.

The opening may have the same rectangular shape as the blank mask, the shutter may include a vertical shutter configured to move to the center of the opening from upper and lower sides or return therefrom, and a horizontal shutter configured to move to the center of the opening from left and right sides or return therefrom, and the vertical and horizontal shutters are configured to be positioned at such a height that the vertical and horizontal shutters do not interfere with each other as they move to the center of the opening or return therefrom.

The shadow mask may further include a detection unit provided on the one surface of the mask, and a transmission unit connected to the detection unit and the shutter, and configured to transmit a force to move the shutter when a predetermined force is applied to the detection unit.

The transmission unit may be an actuator configured to convert the force received from the detection unit into a movement of the shutter via hydraulic or pneumatic pressure.

The detection unit may include a first sawtooth portion configured to linearly move when the predetermined force is applied, the shutter may include a second sawtooth portion, the transmission unit may include a gear portion engaged with the first and second sawtooth portions, and the transmission unit is configured to convert the linear movement of the detection unit into a movement of the shutter through the gear portion.

The detection unit may include a first detection unit and a second detection unit, the first detection unit may include a first transmission unit configured to transmit the force to move the vertical shutter when the predetermined force is applied to the detection unit, and the second detection unit may include a second transmission unit configured to transmit the force to move the horizontal shutter when the predetermined force is applied to the detection unit.

The shadow mask may further include a guide rail in a portion of an inner space of the mask, an opening rail is provided between the mask and the shutter, which opens up the portion of the inner space of the mask, a groove portion is positioned at a partial path of the guide rail, the shutter may include a sliding unit configured to move while being engaged with the guide rail, and a support configured to connect the sliding unit and the shutter, and the sliding unit may be fixedly engaged with the groove portion.

The shadow mask may further include a vertical guide rail in a portion of an inner space of the mask, and a horizontal guide rail in the other portion of the inner space of the mask, a vertical opening rail which is provided between the mask and the vertical shutter and through which the portion of the inner space of the mask is open, and a horizontal opening rail which is provided between the mask and the horizontal shutter and through which the other portion of the inner space of the mask is open. A first groove portion positioned at a partial path of the vertical guide rail and a second groove portion positioned at a partial path of the horizontal guide rail may be included, the vertical shutter may include a first sliding portion configured to move while being engaged with the vertical guide rail, and a first support configured to connect the first sliding portion and the vertical shutter, the horizontal shutter may include a second sliding portion configured to move while being engaged with the horizontal guide rail, and a second support configured to connect the second sliding portion and the horizontal shutter, the first sliding portion may be fixedly engaged with the first groove portion, and the second sliding portion may be fixedly engaged with the second groove portion.

The mask may include aluminium or an aluminium alloy.

The shutter may move from the edge to the center of the opening by 1 mm to 10 mm to adjust the size of the opening.

In another general aspect, a method of manufacturing a blank mask includes providing a film formation apparatus to which a shadow mask is applied, and forming a film as a target layer in the film formation apparatus, the shadow mask including: a mask including one surface, another surface, and an opening that passes from one surface to the other; and a shutter provided on the one surface of the mask and configured to adjust a size of the opening, and wherein the shutter is configured to move from an edge to a center of the opening to adjust the size of the opening, and is applied in manufacturing the blank mask for a semiconductor lithography process.

The forming of the film may include adjusting the size of the opening by moving the shutter of the shadow mask, and forming the film on a predetermined substrate while a raw material passes through the opening of the shadow mask.

The adjusting of the size of the opening may include moving the shutter by applying a force to a detection unit through a predetermined support in the film forming apparatus.

Other features and aspects will be apparent from the following detailed description, the drawings, and the claims.

BRIEF DESCRIPTION OF THE DRAWINGS

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

Figure 1:
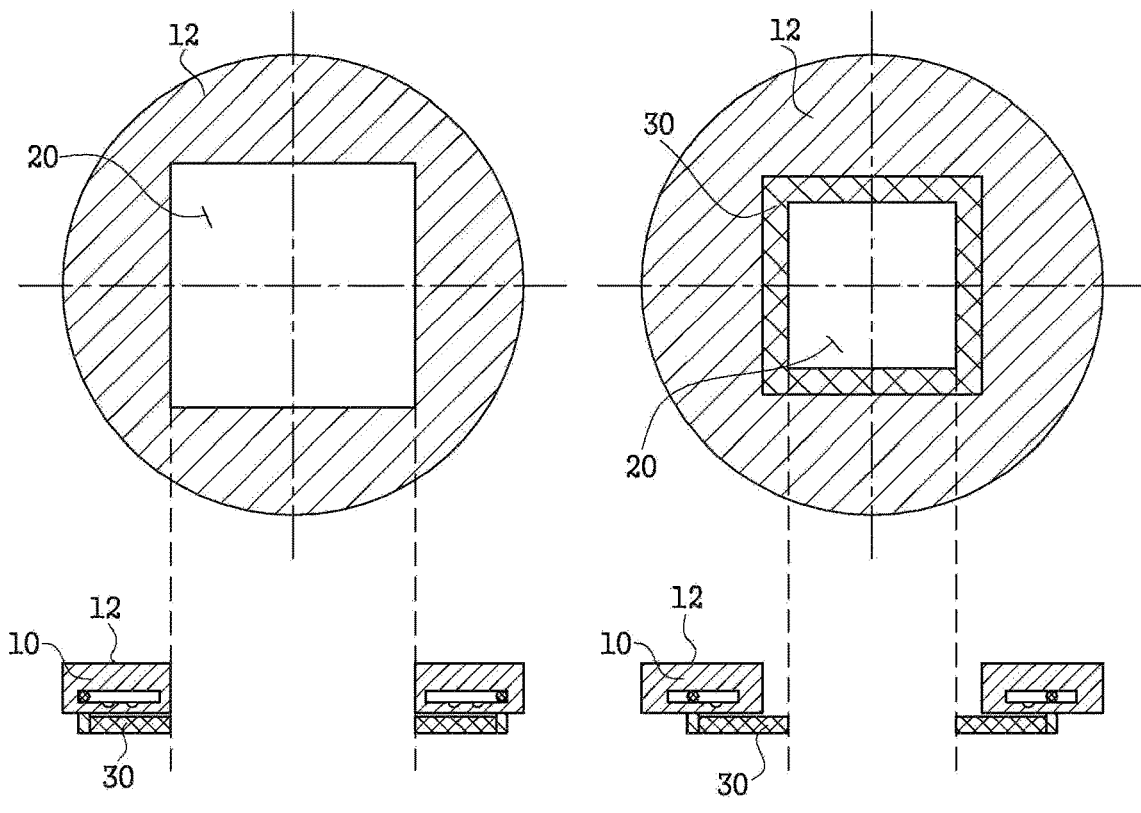
FIG. 1 is a schematic view illustrating an example of a shadow mask according to an implementation.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

In the present specification, the term "combination of these components" included in the expression of the Markush form means one or more mixtures or combinations selected from the group consisting of components described in the expression of the Markush form and means a state of including one or more selected from the group consisting of the above components.

Shadow Mask 100

In order to achieve the above objectives, the shadow mask 100 according to the embodiment includes a mask 10 including one surface 11 and another surface 12, an opening 20 passing through the one surface 11 and the other surface 12, and a shutter 30 provided on the one surface 11 of the mask 10 and configured to adjust the size of the opening 20. The shutter 30 moves from an edge of the opening 20 toward a center of the opening 20 to adjust the size of the opening 20, and the shadow mask 100 may be applied to the fabrication of a blank mask for a semiconductor lithography process.

Referring to FIGS. 1-3 and 7, the shadow mask 100 may include a plurality of shutters 30 that adjust the size and circumference of the opening 20 in the one surface 11 of the mask 10.

The mask 10 may include aluminum or the like and may include an aluminum alloy such as A5052 or A5056.

The opening 20 may have substantially the same shape as a blank mask to be manufactured, exemplarily a rectangular shape.

Referring to FIG. 1, the shutter 30 may adjust the size of the opening 20 by moving 1 mm to 10 mm from the edge toward the center of the opening 20, moving 1 mm to 8 mm from the edge toward the center of the opening 20, or moving 1 mm to 6 mm from the edge toward the center of the opening 20. Further, the shutter may be moved from the edge toward the center of the opening 20 by one or more distances in the range of 1 mm to 10 mm before being fixed. In this way, since the size of the opening 20 may be adjusted via the shutter 30, the process of replacing the shadow mask in the substrate thin film formation process can be omitted and the manufacturing process can be simplified.

When the opening 20 has a polygonal shape with a plurality of sides, one shutter may be disposed on each side, and the shutters 30 may be disposed at different heights to prevent movement interference with each other.

Figure 7:
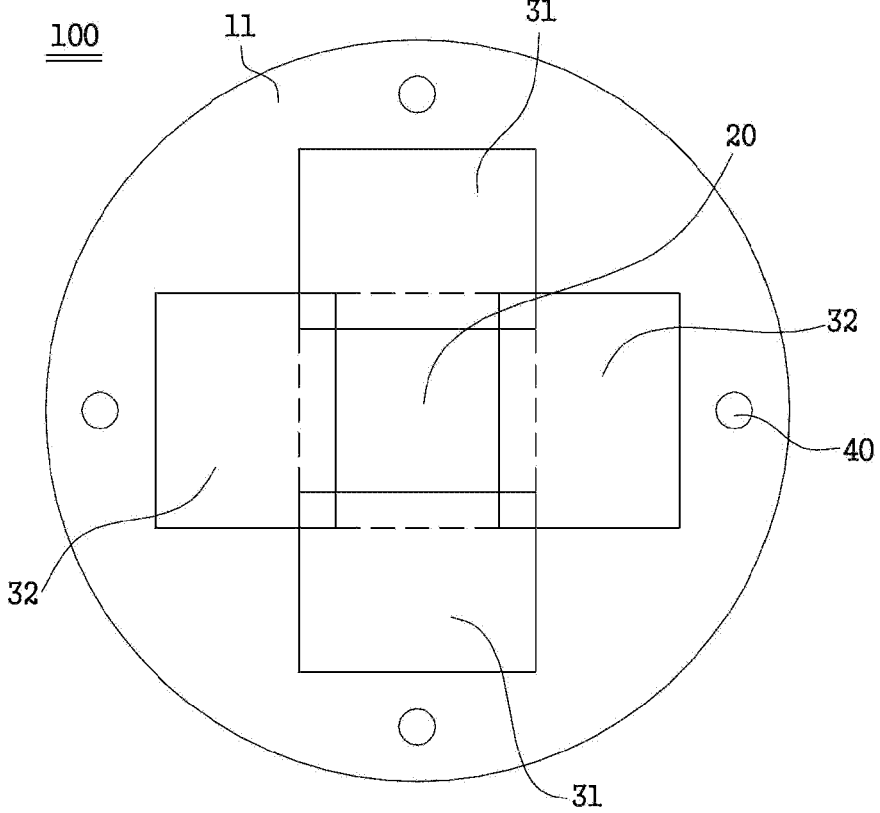
FIG. 7 is a schematic view illustrating a partial structure of the shadow mask according to the implementation when viewed from the bottom.

When the opening 20 has a rectangular shape that is substantially the same shape as the blank mask, the shutter 30 includes a vertical shutter 31 that moves from an upper side and a lower side toward the center of the opening 20 or returns therefrom, and a horizontal shutter 32 that moves from a lateral side and another lateral side toward the center of the opening 20 or returns therefrom. Referring to FIG. 7, the vertical shutter 31 and the horizontal shutter 32 may be positioned at such a height that the vertical shutter 31 and the horizontal shutter 32 do not interfere with each other when moving toward or returning from the center of the opening 20. For example, one of the vertical shutter 31 and the horizontal shutter 32 may be located at a relatively high height, and the other may be located at a relatively low height.

The vertical shutter 31 and the horizontal shutter 32 may be moved to the center of the opening 20 or returned the same distance.

The vertical shutter 31 and the horizontal shutter 32 may be moved separately or simultaneously.

The shadow mask 100 includes a detection unit 40 provided on one surface 11 of the mask 10, and a transmission unit 50 connected to the detection unit 40 and the shutter 30 and configured to transmit a force to move the shutter when a predetermined force is applied to the detection unit 40.

Figure 8:
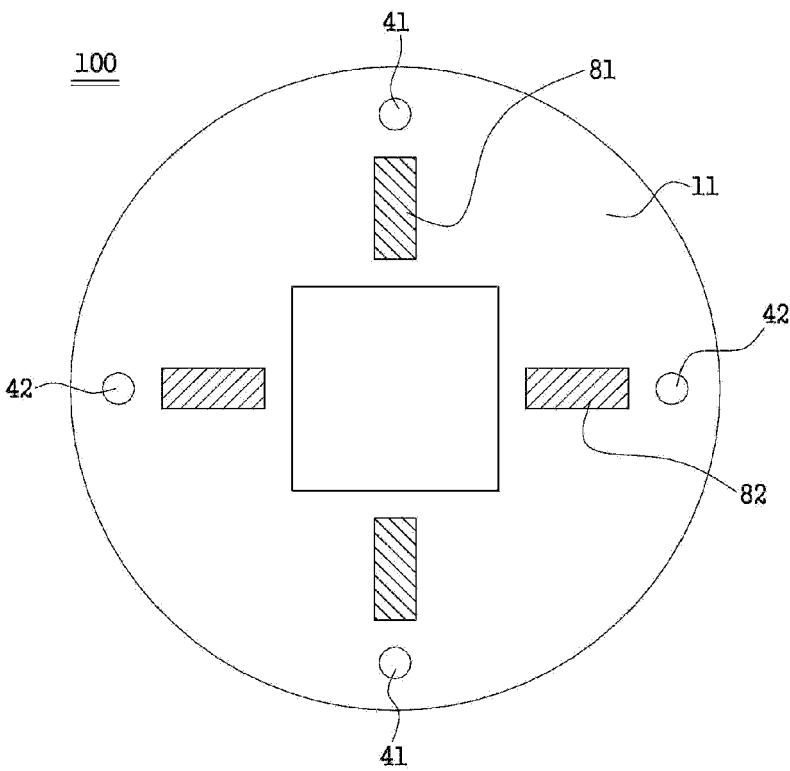
FIG. 8 is a schematic view illustrating another partial structure of the shadow mask according to the implementation when viewed from the top.

As illustrated in FIGS. 7 and 8, the detection unit 40 may be provided with a plurality of detection units 40 on the one surface 11 where the shutter 30 is provided, and one detection unit 40 may be provided on each shutter 30.

Figure 4:
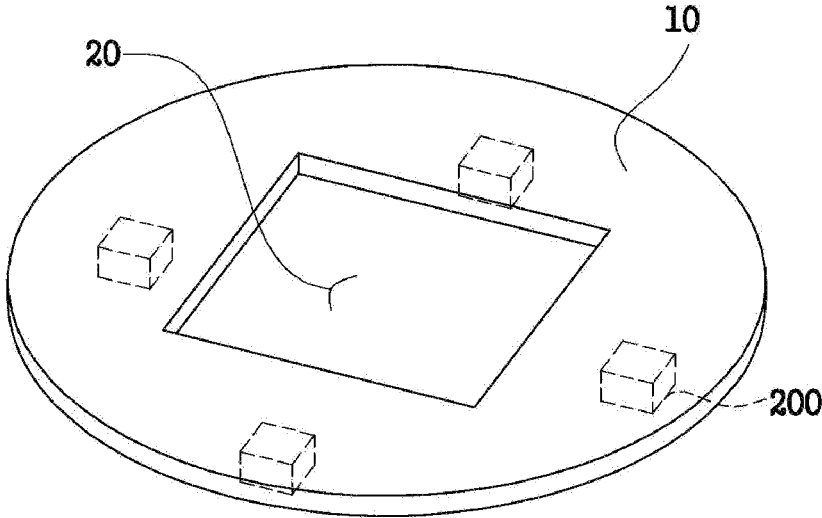
FIG. 4 is a schematic perspective view illustrating a state in which the shadow mask according to the implementation is supported by a support.

As illustrated in FIG. 4, the detection unit 40 may receive force and pressure from a predetermined support 200 facing the shadow mask 100, and may convert the force and pressure into movement of the shutter 30 through the member, which will be described below. The support 200 may be located outside of the member such that the substrate may be mounted within the chamber.

Figure 6:
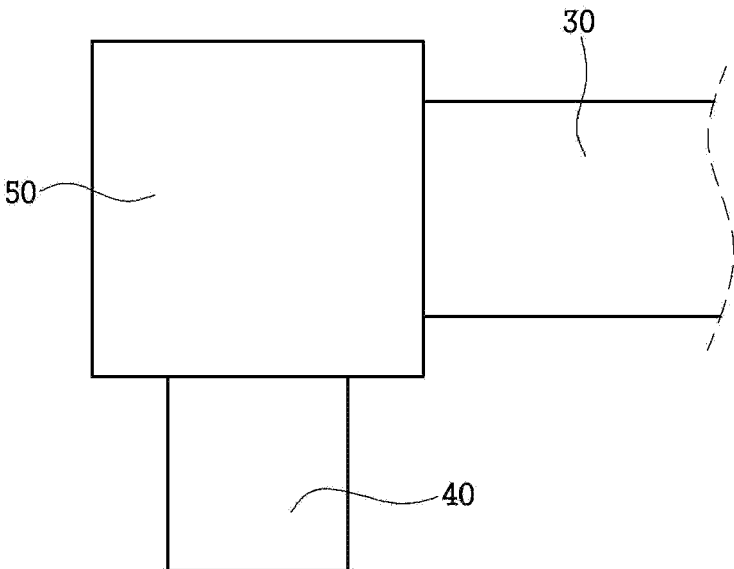
FIG. 6 is a schematic view illustrating an example of a transmission unit of a shadow mask according to an implementation.

The transmission unit 50 may include an actuator that converts the force transmitted from the detection unit 40 into movement of the shutter 30 via hydraulic or pneumatic pressure. Referring to FIG. 6, when a predetermined force is applied to the detection unit 40 by the support 200 or the like, the transmission unit 50 including the actuator may cause the shutter 30 to move, and when the application of the predetermined force by the support 200 ceases, the shutter 30 may return to its original state prior to movement.

Figure 3:
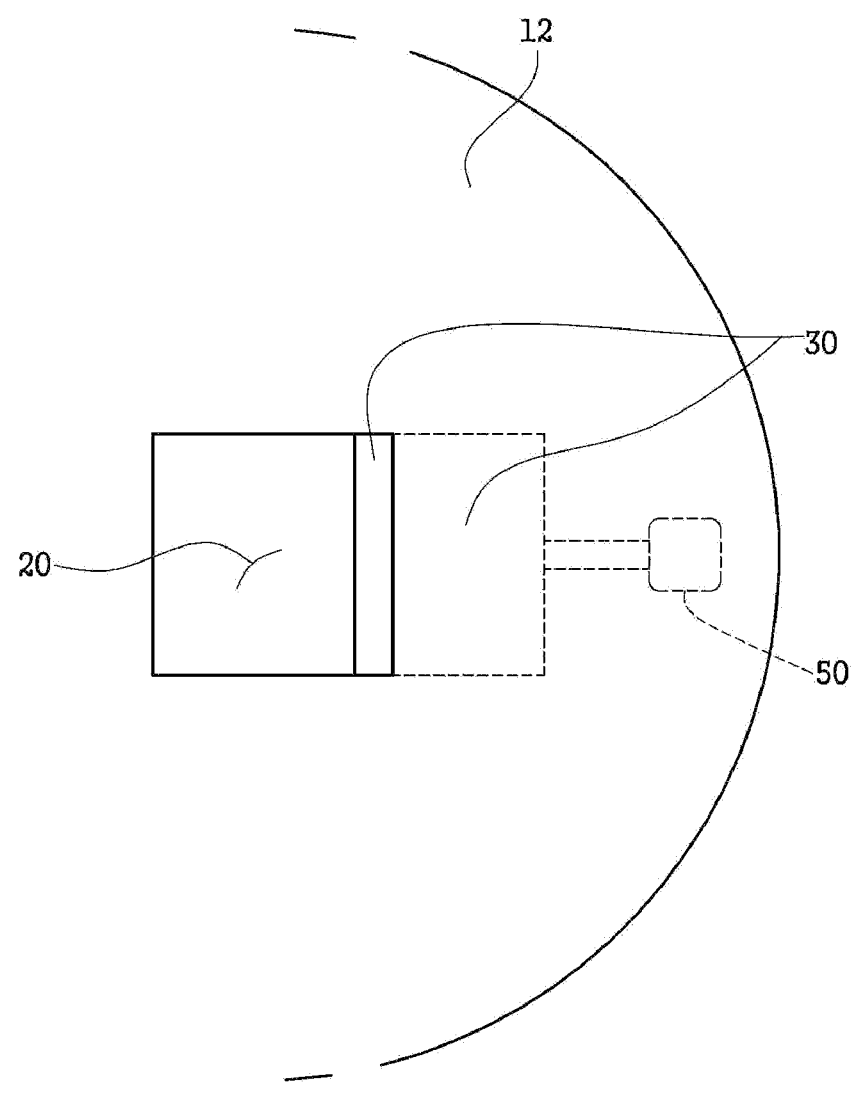
FIG. 3 is a schematic view illustrating a partial structure of the shadow mask according to the implementation when viewed from the top.

Referring to FIG. 3, the transmission unit 50 may be directly connected to the shutter 30 to transmit a force and may be connected to a sliding unit 33 illustrated in FIGS. 9 and 10, which will be described below, to transmit the force to the shutter 30.

Further, the detection unit 40 includes a first sawtooth portion 61 that moves linearly when a predetermined force is applied, and the shutter 30 includes a second sawtooth portion 62. The transmission unit 50 includes a gear portion 63 engaged with the first sawtooth portion 61 and the second sawtooth portion 62. The transmission unit 50 may convert a linear movement of the detection unit 40 into a movement of the shutter 30 via the gear portion 63.

Figure 5:
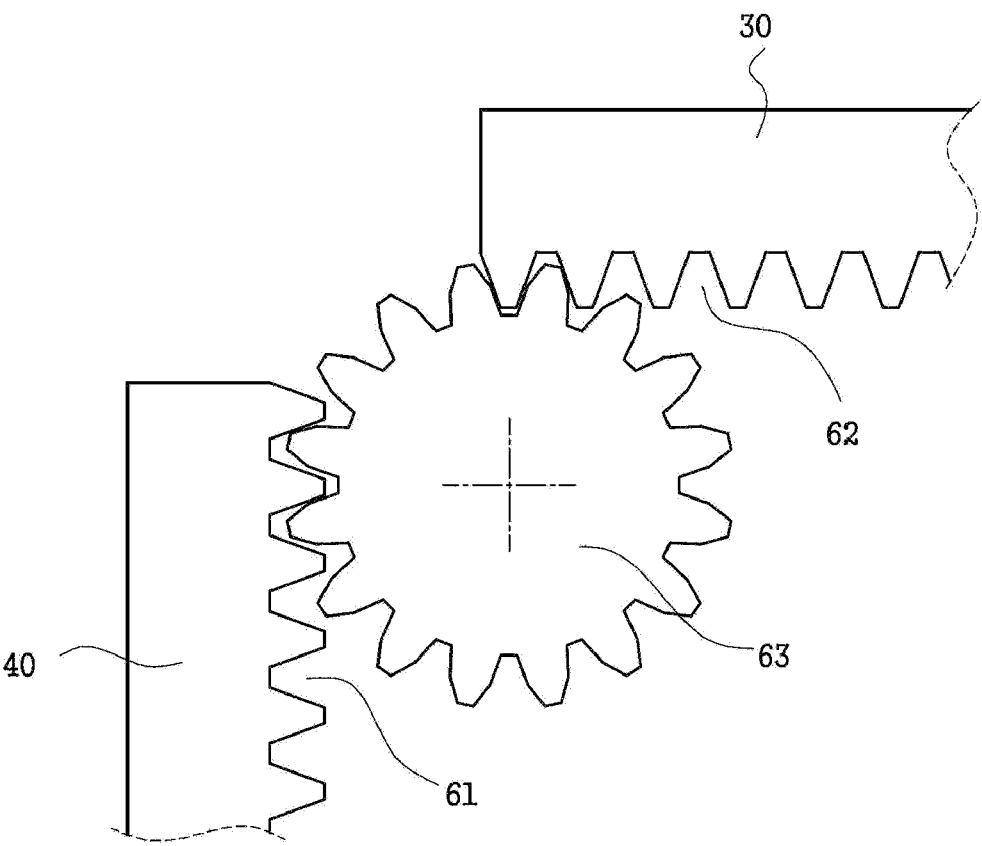
FIG. 5 is a schematic view illustrating an example of a gear part of the shadow mask according to the implementation.

Referring to FIG. 5, when a predetermined force is applied to the detection unit 40, such as by the support 200, the detection unit 40 may move linearly to move or rotate the gear portion 63, which is a transmission unit engaging the first sawtooth portion 61, and the gear portion 63 may move the shutter 30 in engagement with the second sawtooth portion 62. The detection unit 40 may further include an elastic member, such as a separate spring, and when the application of a predetermined force by the support 200 ceases, the shutter 30 may return to a state prior to movement.

The first detection unit 40 includes a first detection unit 41 and a second detection unit 42. The first detection unit 41 may include a first transmission unit configured to transmit a force to move the vertical shutter 31 when a predetermined force is applied to the first detection unit 41. The second detection unit 42 may include a second transmission unit configured to transmit a force to move the horizontal shutter 32 when a predetermined force is applied to the second detection unit 42.

Referring to FIGS. 7 and 8, the first detection unit 41 may be disposed near the vertical shutter 31, may be disposed above the shutter at an upper portion of the vertical shutter 31 or below the shutter at a lower portion of the vertical shutter 31, and may be disposed in a position such that the first detection unit 41 does not interfere with the vertical shutter 31. The second detection unit 42 may be disposed near the horizontal shutter 32, may be disposed to the right of the shutter disposed in the right portion of the horizontal shutter 32 or to the left of the shutter disposed in the left portion of the horizontal shutter 32, and may be disposed in a position where the second detection unit 42 does not interfere with the horizontal shutter 32.

Figure 2:
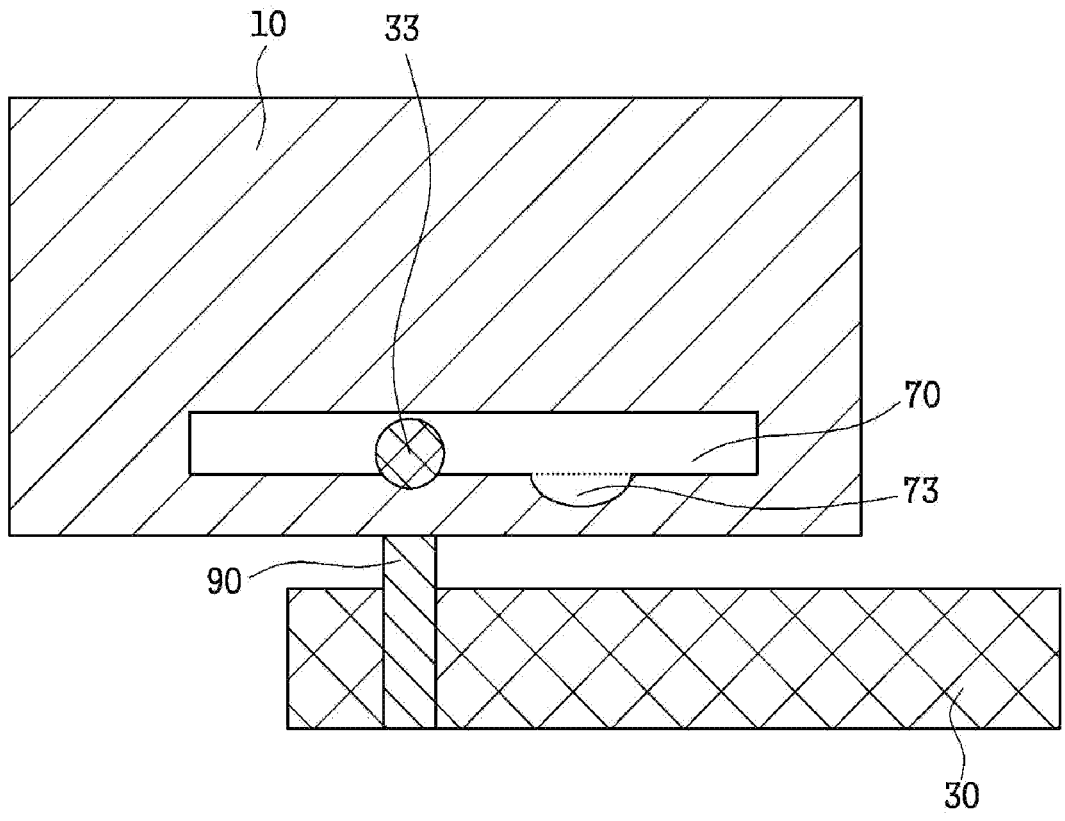
FIG. 2 is a schematic view illustrating a partial structure of the shadow mask according to the implementation.
Figure 10:
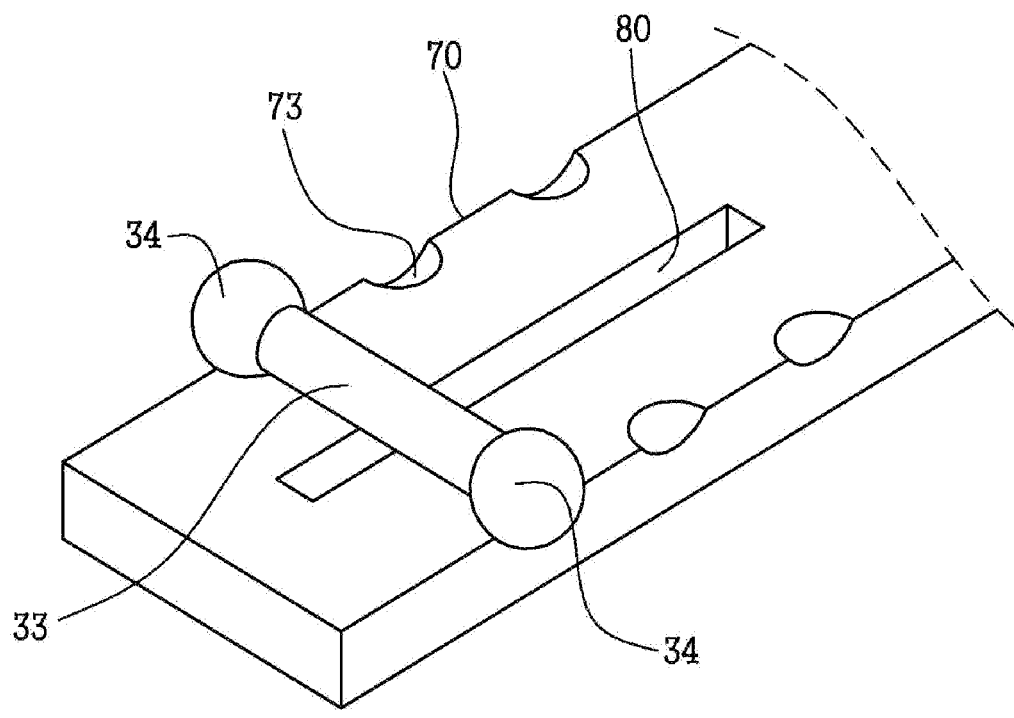
FIG. 10 is a schematic view illustrating an example of a sliding portion of the shadow mask according to an implementation.

Referring to FIGS. 1, 2, and 10, a guide rail 70 is included in a portion of the interior space of the mask 10. An opening rail 80 is provided between the mask 10 and the shutter 30 and includes a portion of the interior space of the mask 10 that is open. It includes a groove portion 73 disposed in a partial path of the guide rail 70. The shutter 30 includes a sliding unit 33 movable in engagement with the guide rail 70, and a support 90 for connecting the sliding unit 33 and the shutter 30. The sliding unit 33 may be fixedly engaged with the groove portion 73.

Figure 9:
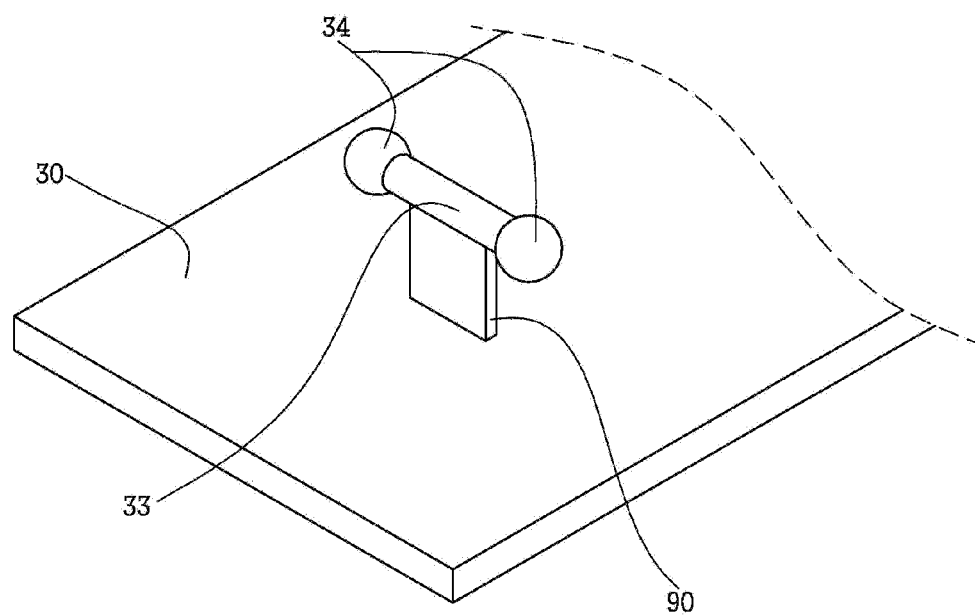
FIG. 9 is a schematic view illustrating an example of a shutter of the shadow mask according to the implementation.

Referring to FIG. 9, the support 90 may be disposed on one surface of the shutter 30, and may have a width that allows the support 90 to reciprocate through the opening rail 80.

Referring to FIGS. 2 and 10, the groove portion 73 of the guide rail 70 may have the same or similar shape to the protrusion portion 34 of the sliding unit 33, and may be temporarily fixed by engaging the protrusion portion 34. The protrusion portion 34 may be provided at one end and/or the other end of the sliding unit 33, and may be provided at any location on the sliding unit 33 where they may engage with the groove portion 73. Exemplarily, the protrusion portion 34 may include a spherical shape, and the groove portion may have a concave shape in which a portion of the spherical shape is received. The shutter 30, including the sliding unit 33, may be temporarily fixed and moved when a predetermined force is applied.

The guide rail 70 may include a space in which the linear movement of the sliding unit 33 is fixed, and may allow for smooth movement of the shutter 30 connected to the sliding unit 33 via the support 90.

The sliding unit 33 may be connected to the transmission unit 50, and when a predetermined force is applied to the detection unit 40, the sliding unit 33 and the shutter 30 connected to the sliding unit 33 may perform linear movement through the transmission unit 50.

Referring to FIGS. 7 and 8, a vertical guide rail is included in a portion of the interior space of the mask 10, and a horizontal guide rail is included in another portion of the interior space of the mask 10. A vertical opening rail 81 which is provided between the mask 10 and the vertical shutter 31 and through which the portion of the interior space of the mask 10 is open, and a horizontal opening rail 82 which is provided between the mask 10 and the horizontal shutter 32 and through which the other portion of the interior space of the mask 10 is open are included. A first groove portion positioned at a partial path of the vertical guide rail and a second groove portion positioned at a partial path of the horizontal guide rail are included. The vertical shutter 31 includes a first sliding portion that may move while being engaged with the vertical guide rail and a first support for connecting the first sliding portion and the vertical shutter 31. The horizontal shutter 32 includes a second sliding portion that may move while being engaged with the horizontal guide rail and a second support for connecting the second sliding portion and the horizontal shutter 32. The first sliding portion may be fixedly engaged with the first groove portion. The second sliding portion may be fixedly engaged with the second groove portion.

The first sliding portion may linearly move by the transmission unit 50 connected to the first detection unit 41, and the second sliding portion may linearly move by the transmission unit 50 connected to the second detection unit 42. Further, as illustrated in FIG. 4, the vertical shutter 31 and the horizontal shutter 32 may move by the force and pressure of the predetermined support 200 directed to the shadow mask 100, and the size of the opening 20 may be changed by the movement of the vertical shutter 31 and the horizontal shutter 32.

The first support portion and the second support portion may have different lengths, and thus the vertical shutter 31 and the horizontal shutter 32 may have different heights so that they do not interfere when moved.

Since the shadow mask 100 is moved and fixed to a target position by manipulating the support 200 in the chamber, and then the size of the opening 20 can be adjusted as force is transferred to the support 200, the detection unit 40, the transmission unit 50, and the shutter 30, the process can be simplified by facilitating film formation of the blank mask and eliminating the need for a separate mask change or chamber opening.

Method of Manufacturing a Blank Mask

In order to achieve the above objectives, a blank mask manufacturing method according to an example includes the steps of providing a film formation apparatus to which a shadow mask is applied, and forming a film on a target layer in the film formation apparatus.

The forming of the film includes adjusting the size of the opening by moving a shutter of the shadow mask, and forming the film on a predetermined substrate while a raw material passes through the opening of the shadow mask.

When adjusting the size of the opening, the shutter may be moved by applying a force to the detection unit included in the shadow mask via a support in the chamber, which is the film formation apparatus.

When adjusting the size of the opening, the shadow mask may be moved to the target position and simultaneously move the shutter via a predetermined support in the chamber. For example, after the shadow mask is fixed at the target position, the force applied to the support may be adjusted, thereby adjusting the degree of movement of the shutter and the size of the opening.

In forming a film on a predetermined substrate, while forming a film including a plurality of different layers, in the process of forming a film of each layer, the size of the opening may be different, and the size of the opening may gradually decrease. For example, when a laminated structure of a lower layer/intermediate layer/upper layer is formed, the film may be formed without adjusting the size of the opening when the lower layer is formed, the film may be formed after adjusting the size of the opening by moving the shutter from the edge toward the center of the opening in a range of 1 mm to 2 mm when the intermediate layer is formed, and the film may be formed after adjusting the size of the opening when the upper layer is formed so that the size of the opening in the upper layer is smaller than the size of the opening in the intermediate layer.

According to an implementation, as the size of the opening of the shadow mask is adjusted in a predetermined manner, the manufacturing method of the blank mask can be advantageously simplified without a separate change of the shadow mask, and a blank mask having excellent quality can be obtained.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A shadow mask comprising:
a mask comprising one surface, another surface, and an opening that passes from one surface to the other;
a shutter provided on the one surface of the mask and configured to adjust a size of the opening; and
a guide rail in a portion of an inner space of the mask,
wherein the shutter is configured to move from an edge to a center of the opening to adjust the size of the opening,
wherein the shadow mask is applied in manufacturing a blank mask for a semiconductor lithography process,
wherein an opening rail is provided between the mask and the shutter, which opens up the portion of the inner space of the mask,
wherein a groove portion is positioned at a partial path of the guide rail,
wherein the shutter comprises a sliding unit configured to move while being engaged with the guide rail, and a support configured to connect the sliding unit and the shutter, and
wherein the sliding unit is fixedly engaged with the groove portion.

2. The shadow mask of claim 1,
wherein the opening has the same rectangular shape as the blank mask,
wherein the shutter comprises:
a vertical shutter configured to move to the center of the opening from upper and lower sides or return therefrom; and
a horizontal shutter configured to move to the center of the opening from left and right sides or return therefrom, and
wherein the vertical and horizontal shutters are configured to be positioned at such a height that the vertical and horizontal shutters do not interfere with each other as they move to the center of the opening or return therefrom.

3. The shadow mask of claim 2, further comprising:
a detection unit provided on the one surface of the mask and configured to move linearly in response to a predetermined force; and a transmission unit connected to the detection unit and the shutter, and configured to transmit a force to move the shutter when a predetermined force is applied to the detection unit.

4. The shadow mask of claim 3, wherein the transmission unit is an actuator operatively coupled to the detection unit and configured to convert the force received from the detection unit into movement of the shutter via hydraulic or pneumatic pressure.

5. The shadow mask of claim 3,
wherein the detection unit comprises a first sawtooth portion configured to linearly move when the predetermined force is applied,
wherein the shutter comprises a second sawtooth portion,
wherein the transmission unit comprises a gear portion engaged with the first and second sawtooth portions, and
wherein the transmission unit is configured to convert the linear movement of the detection unit into movement of the shutter through the gear portion.

6. The shadow mask of claim 3,
wherein the detection unit comprises a first detection unit and a second detection unit,
wherein the first detection unit comprises a first transmission unit configured to transmit the force to move the vertical shutter when the predetermined force is applied to the detection unit, and
wherein the second detection unit comprises a second transmission unit configured to transmit the force to move the horizontal shutter when the predetermined force is applied to the detection unit.

7. The shadow mask of claim 1, wherein the mask comprises aluminium or an aluminium alloy.

8. The shadow mask of claim 1, wherein the shutter moves from the edge to the center of the opening by 1 mm to 10 mm to adjust the size of the opening.

9. A method of manufacturing a blank mask, the method comprising:
providing a film formation apparatus to which the shadow mask of claim 1 is applied; and
forming a film as a target layer in the film formation apparatus.

10. The method of claim 9, wherein the forming of the film comprises:
adjusting the size of the opening by moving the shutter of the shadow mask; and
forming the film on a predetermined substrate while a raw material passes through the opening of the shadow mask.

11. The method of claim 10, wherein the adjusting of the size of the opening comprises:
moving the shutter by applying a force to a detection unit through a predetermined support in the film forming apparatus.

12. A shadow mask comprising:
a mask comprising one surface, another surface, and an opening that passes from one surface to the other;
a shutter provided on the one surface of the mask and configured to adjust a size of the opening;
a detection unit provided on the one surface of the mask and configured to move linearly in response to a predetermined force;
a transmission unit connected to the detection unit and the shutter, and configured to transmit a force to move the shutter when a predetermined force is applied to the detection unit;

a vertical guide rail in a portion of an inner space of the mask, and a horizontal guide rail in the other portion of the inner space of the mask;

a vertical opening rail which is provided between the mask and the vertical shutter and through which the portion of the inner space of the mask is open; and a horizontal opening rail which is provided between the mask and the horizontal shutter and through which the other portion of the inner space of the mask is open, wherein the shutter is configured to move from an edge to a center of the opening to adjust the size of the opening, wherein the shadow mask is applied in manufacturing a blank mask for a semiconductor lithography process, wherein the opening has the same rectangular shape as the blank mask, wherein the shutter comprises:

a vertical shutter configured to move to the center of the opening from upper and lower sides or return therefrom; and a horizontal shutter configured to move to the center of the opening from left and right sides or return therefrom, wherein the vertical and horizontal shutters are configured to be positioned at such a height that the vertical and horizontal shutters do not interfere with each other as they move to the center of the opening or return therefrom, wherein a first groove portion is positioned at a partial path of the vertical guide rail and a second groove portion is positioned at a partial path of the horizontal guide rail, wherein the vertical shutter comprises a first sliding portion configured to move while being engaged with the vertical guide rail, and a first support configured to connect the first sliding portion and the vertical shutter, wherein the horizontal shutter comprises a second sliding portion configured to move while being engaged with the horizontal guide rail, and a second support configured to connect the second sliding portion and the horizontal shutter, and wherein the first sliding portion is fixedly engaged with the first groove portion, and the second sliding portion is fixedly engaged with the second groove portion.

* * * * *